(12) United States Patent
Venema

(10) Patent No.: US 7,671,319 B2
(45) Date of Patent: *Mar. 2, 2010

(54) LITHOGRAPHIC APPARATUS, DEVICE MANUFACTURING METHOD AND ENERGY SENSOR

(75) Inventor: Willem Jurrianus Venema, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 45 days.

This patent is subject to a terminal disclaimer.

(21) Appl. No.: 11/711,873

(22) Filed: Feb. 28, 2007

(65) Prior Publication Data

US 2007/0216890 A1 Sep. 20, 2007

Related U.S. Application Data

(63) Continuation-in-part of application No. 11/363,276, filed on Feb. 28, 2006.

(51) Int. Cl.
*H01J 40/14* (2006.01)
*H01L 31/00* (2006.01)
(52) U.S. Cl. ............................. 250/214 R; 250/214.1
(58) Field of Classification Search ................. 250/548, 250/585, 586, 214.1, 214 R, 206; 355/53, 355/68, 69; 356/399
See application file for complete search history.

(56) References Cited

U.S. PATENT DOCUMENTS

| 3,426,208 | A | * | 2/1969 | Griffiths et al. ............. 250/200 |
| 4,396,911 | A | * | 8/1983 | Motsinger et al. ........... 340/617 |
| 5,134,273 | A | * | 7/1992 | Wani et al. .................. 250/205 |
| 6,618,449 | B1 | * | 9/2003 | Laviec et al. ................ 375/335 |
| 2002/0037461 | A1 | * | 3/2002 | Van Der Werf et al. ....... 430/30 |
| 2002/0100864 | A1 | * | 8/2002 | Wake ...................... 250/208.1 |
| 2004/0006443 | A1 | * | 1/2004 | Huber-Lenk et al. ........ 702/150 |

FOREIGN PATENT DOCUMENTS

EP 0 906 590 B1 8/2003

* cited by examiner

*Primary Examiner*—Georgia Y Epps
*Assistant Examiner*—Jennifer Bennett
(74) *Attorney, Agent, or Firm*—Pillsbury Winthrop Shaw Pittman LLP

(57) ABSTRACT

An energy sensor comprises a radiation-sensitive detector, a circuit, and an analog-to-digital converter. The radiation-sensitive detector is arranged to receive a pulsed radiation beam and to generate a current in response thereto. The circuit is equivalent to an RC network and is electrically connected across the radiation-sensitive detector. The analog-to-digital converter is electrically connected across a resistive component of the circuit and is arranged to output digital samples measuring the voltage across the resistive component at a sampling rate that is greater than the pulse repetition rate of the pulsed radiation beam. The energy sensor may be provided as part of a transmission image sensor.

29 Claims, 3 Drawing Sheets

LITHOGRAPHIC APPARATUS, DEVICE MANUFACTURING METHOD AND ENERGY SENSOR

This is a continuation-in-part of pending U.S. patent application Ser. No. 11/363,276 filed on Feb. 28, 2006, the entire contents of which are incorporated herein by reference.

BACKGROUND OF THE INVENTION

The present invention relates to a lithographic apparatus, to device manufacturing methods using lithographic apparatus, and energy sensors.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In device manufacturing methods using lithographic apparatus, it is important to ensure that the correct amount of energy (dose) is delivered to the substrate. An incorrect dose causes variation of line width and other imaging errors. Conversely, control of dose level can often be used for fine control of line width or critical dimension. To enable dose control, it is desirable to measure the power output of the radiation source, ideally as close as possible to the substrate. This is particularly important when a pulsed light source, such as an excimer laser, is used as the relationship between input to the light source is complex and may depend on history and factors not under direct control. Many lithographic apparatus divert a known fraction of the projection beam, e.g. using a partly silvered mirror, in the illumination system to an energy sensor. This therefore measures the power output of the radiation source and the effects of the illumination system upstream of the energy sensor during an exposure. Downstream effects can be predicted, based on calibration measurements taken using an energy sensor at substrate level when no exposure is taking place.

As well as dose control, various measurement and metrology processes carried out in lithographic apparatus require a measurement of the power of the radiation source. For example, in a process to align the substrate table to a mask, a sensor known as a transmission image sensor (TIS), which comprises a photodiode covered by a grating, mounted on the substrate table is scanned through the aerial image of a corresponding grating pattern on the mask. The output of the sensor is a periodically varying signal which, along with a position signal, can be used to determine the positional relationship of the substrate table and the mask pattern to a high degree of accuracy. When using a pulsed radiation source, it is desirable to remove the influence of any variation in source output from pulse to pulse. An additional sensor is provided adjacent the TIS to measure the pulse energy. The additional sensor comprises a photodiode connected to a RC network, or equivalent, which is sampled at a fixed time delay after the laser is fired. The resultant voltage measurement is used to normalize the signal from the TIS to eliminate source variations. However, this arrangement does not always give a correct measurement of the energy of a pulse.

. It is therefore desirable to provide an improved method for determining the pulse energy of a pulsed radiation beam.

SUMMARY

According to an aspect of the invention, there is provided a lithographic apparatus having a sensor system comprising a radiation-sensitive detector, a circuit, and an analog-to-digital converter. The radiation-sensitive detector is arranged to receive a pulsed radiation beam comprising radiation pulses having a nominal pulse duration and to generate a current in response thereto. The circuit is equivalent to an RC network, is electrically connected across the radiation-sensitive detector, and has a resistive component. The analog-to-digital converter is electrically connected across the resistive component of the circuit and is arranged to output digital samples measuring voltage across the resistive component at a sampling rate that is greater than 1 divided by the nominal pulse duration.

According to an aspect of the invention, there is provided a device manufacturing method using a lithographic apparatus which has a radiation-sensitive detector arranged to receive a pulsed radiation beam comprising radiation pulses having a nominal pulse duration and to generate a current in response thereto. The detector is connected electrically to a circuit equivalent to an RC network, which circuit has a resistive component. The method comprises digitally sampling the voltage across the resistive component of the circuit at a sampling rate that is greater than 1 divided by the nominal pulse duration.

According to an aspect of the invention, there is provided an energy sensor comprising a radiation-sensitive detector, a circuit, and an analog-to-digital converter. The radiation-sensitive detector is arranged to receive a pulsed radiation beam comprising radiation pulses having a nominal pulse duration and to generate a current in response thereto. The circuit is equivalent to an RC network, is electrically connected across the radiation-sensitive detector, and has a resistive component. The analog-to-digital converter is connected electrically across the resistive component of the circuit and is arranged to output digital samples measuring the voltage across the resistive component at a sampling rate that is greater than 1 divided by the nominal pulse duration.

DETAILED DESCRIPTION

Figure 1:
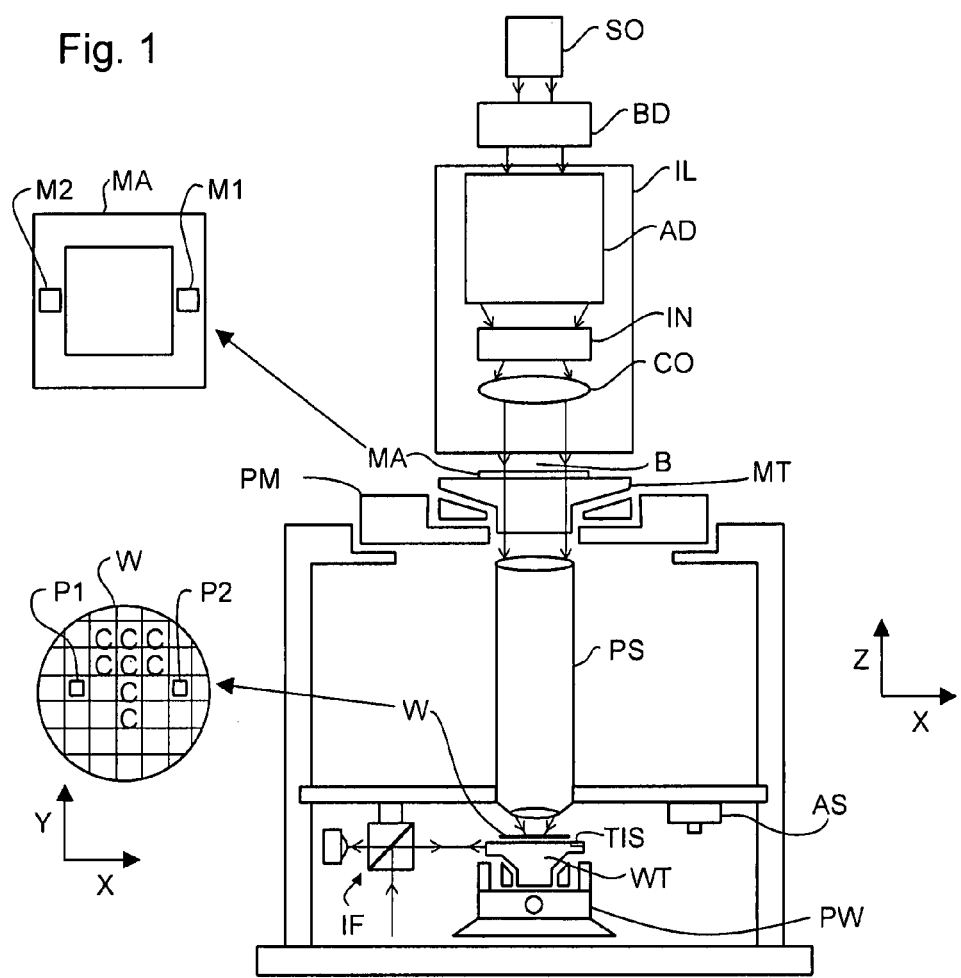
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation)
- a support structure (e.g. a mask table) MT constructed to support a patterning device (e.g. a mask) MA and connected to a first positioner PM configured to accurately position the patterning device in accordance with certain parameters
- a substrate table (e.g. a wafer table) WT constructed to hold a substrate (e.g. a resist-coated wafer) W and connected to a second positioner PW configured to accurately position the substrate in accordance with certain parameters
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam B from a radiation source SO. The source SO and the lithographic apparatus may be separate entities, for example when the source SO is an excimer laser. In such cases, the source SO is not considered to form part of the lithographic apparatus and the radiation beam B is passed from the source SO to the illuminator IL with the aid of a beam delivery system BD comprising, for example, suitable directing mirrors and/or a beam expander. In other cases, the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B, to have a desired uniformity and intensity distribution in its cross-section.

. The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment markers M1, M2 and substrate alignment markers P1, P2. Although the substrate alignment markers as illustrated occupy dedicated target portions, they may be located in spaces between target portions C (these are known as scribe-lane alignment markers). Similarly, in situations in which more than one die is provided on the mask MA, the mask alignment markers may be located between the dies.

The depicted apparatus could be used in at least one of the following modes:

1. In step mode, the mask table MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam B is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the mask table MT is kept essentially stationary holding a programmable patterning device MA, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type referred to above.

Combinations and/or variations on the above described modes of use or entirely different modes of use may also be employed.

Figure 2:
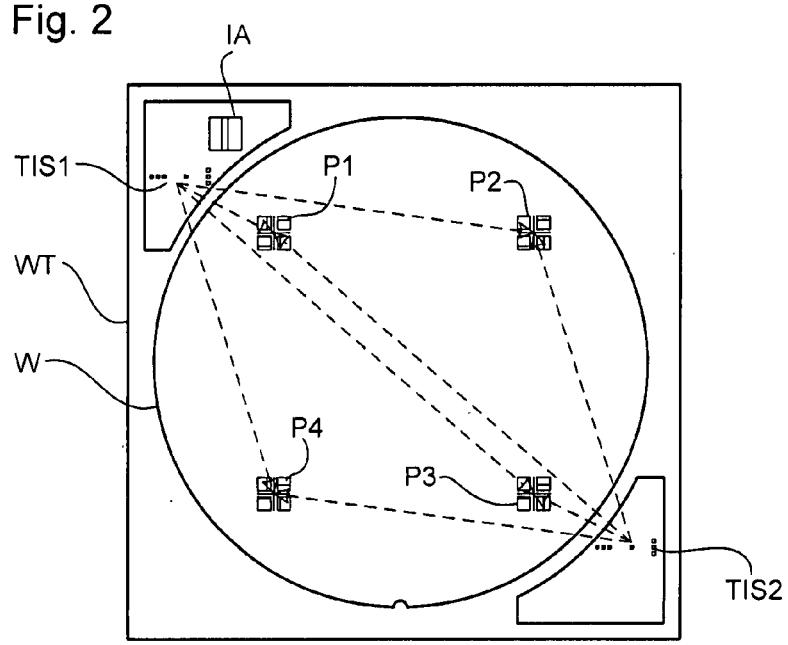
FIG. 2 depicts the substrate stage of the apparatus of FIG. 1.

The apparatus also comprises an alignment sensor AS, which may be mounted at the measurement station of a dual stage apparatus, which is used to detect alignment markers printed on a substrate W and also fixed markers (fiducials) provided on the substrate table WT. This can be seen in FIG. 2, which shows four alignment markers P1-P4 printed on the substrate W and two fixed markers TIS1 and TIS2 provided on the substrate table WT. The substrate table WT may also have on it a sensor IA for an interferometric system that measures properties of the projection system PS, e.g. aberrations, and sensors for other systems that involve detection of a property of an image projected by projection system PS. By scanning the substrate table WT under the alignment sensor AS whilst keep track of its movements using the displacement measurement system IF, the positions, shown by dashed arrows, of the substrate markers P1-P4 relative to the fixed markers TIS1, TIS2 can be determined. Further details of an off-axis alignment system that can be used in such a process are given in EP 0 906 590 A, which document is hereby incorporated by reference in its entirety.

The fixed markers TIS1 and TIS2 have integrated into them an image sensor that can be used to determine the location of an image of a mask marker by scanning the image sensor through the aerial image. Thus, the relative position of the image of the mask marker and the fixed markers TIS1, TIS2 can be determined and the previously obtained relative positions of the substrate markers P1-P4 allow the substrate W to be positioned at any desired position relative to the projected image with great accuracy.

Figure 3:
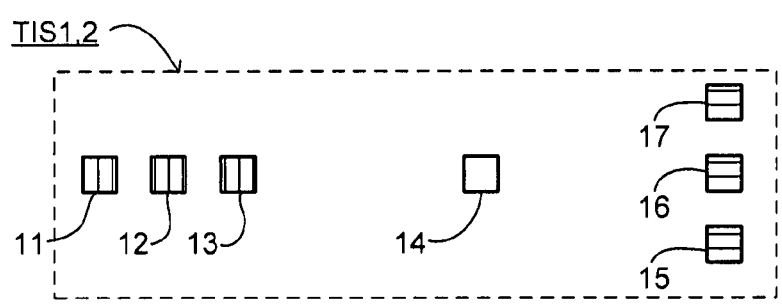
FIG. 3 depicts a transmission image sensor.

The image sensors are shown in FIG. 3. Each image sensor comprises seven photo-sensitive detectors 11 to 17. Three of the photo-sensitive detectors, 11-13, are covered by an opaque, e.g. chrome, layer into which are etched gratings with lines extending in the X direction whilst three others 15-17 are similar but the lines of the gratings extend in the Y direction. The remaining photo-sensitive detector 14 has no covering and is used for capture and/or normalization, as discussed below. As the photo-sensitive detectors 11-13 and 15-17 are scanned through aerial images of gratings corresponding to those provided over the detectors 11-13 and 15-17, the outputs of the detectors 11-13 and 15-17 will fluctuate as bright parts of the aerial images and the apertures of the gratings etched in the opaque layer move into and out of registration. Known signal processing techniques can be used to determine when the center of the marker is aligned with the center of the aerial image. By scanning the sensor through the marker at different positions along the Z axis, the plane of best focus can be detected by detecting the level at which the fluctuations in the outputs of the detectors 11-13 and 15-17 have the greatest amplitude. The central, uncovered detector 14 can be used to find a coarse position for the gratings in the aerial image in a known capture procedure and can also be used to normalize the signals from the grating detectors 11-13 and 15-17 to remove fluctuations due to changes in the output of the illumination system IL, e.g. due to source power variations.

The various photo-sensitive detectors 11-17 may comprise photo-diodes, or other photo-sensitive components covered by a conversion layer. The conversion layer absorbs the incident radiation and emits in response radiation of a longer wavelength. In this way, components sensitive to visible light can be used to detect radiation of shorter wavelength and at the same time are protected from damage by the higher energy photons of the shorter wavelength radiation.

Figure 4:
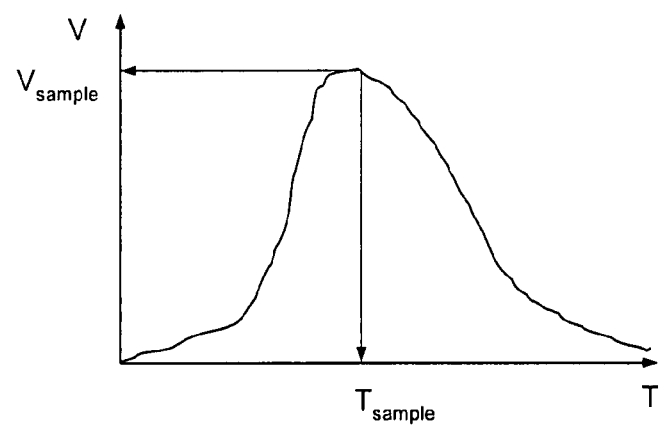
FIG. 4 depicts a voltage output from an RC network sampled at one moment in time.
Figure 6:
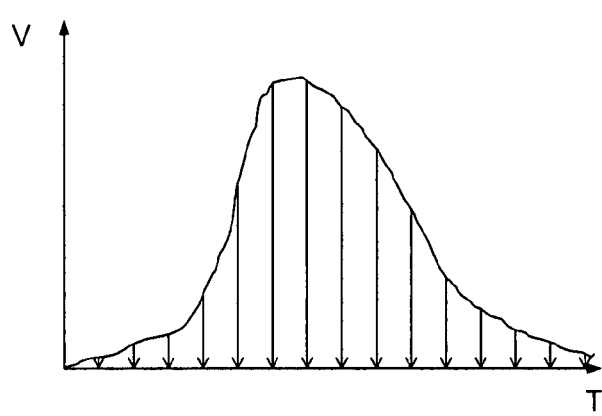
FIG. 6 depicts a voltage output from an RC network sampled at multiple instances in time.

As mentioned above, conventionally the central detector 14 is electrically connected to an RC network, or equivalent, which is sampled at a predetermined time $T_{sample}$ after the radiation source SO is fired. This time is determined so as to correspond as closely as possible to the peak of the energy pulse, as illustrated in FIG. 4, and it was assumed that the resultant measured voltage $V_{sample}$ is related to the total energy of the pulse. However, it has since been determined that the measured voltage $V_{sample}$ is not sufficiently reliably related to the pulse energy. Fluctuations in the laser energy release profile, jitter in the laser firing and jitter in the timing of the sampling circuitry can affect the relationship between $V_{sample}$ and total pulse energy.

According to an embodiment of the present invention, the output of the photosensitive detector 14 is sampled at a plurality of different times during a pulse of the radiation source, to give a more accurate measure of the pulse energy. Preferably, the output is sampled at least 5 times, preferably at least 10 times, preferably at least 20 times during a pulse. Alternatively, the sampling frequency is at least 5 times, at least 10 times, at least 20 times, or at least 50 times the pulse repetition frequency.

Figure 5:
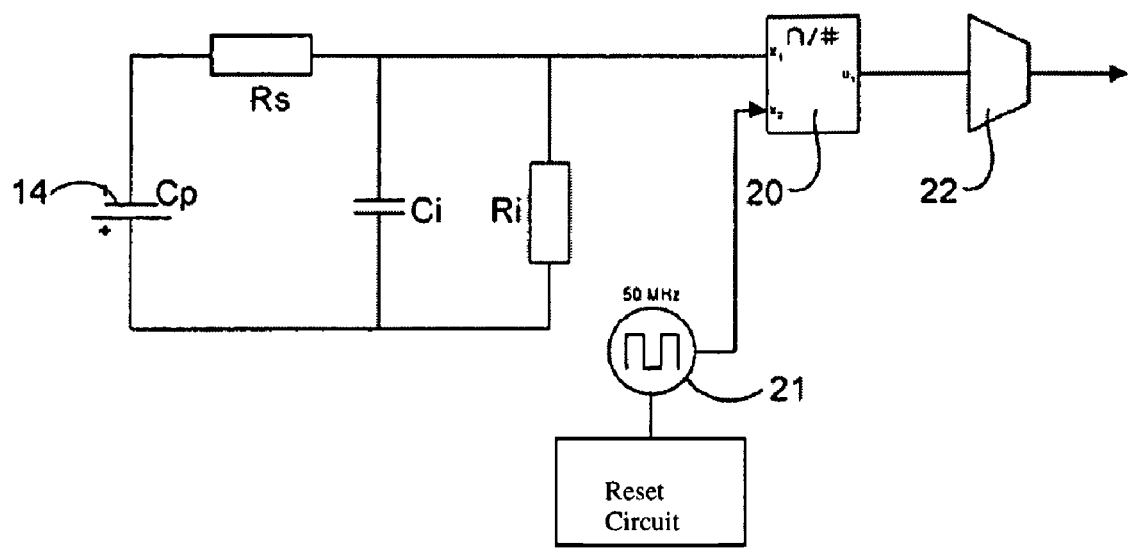
FIG. 5 depicts a sensor according to an embodiment of the invention.

As shown in FIG. 5, this can be arranged by connecting the photo-sensitive detector 14, which may for example be a photodiode with an inherent capacitance Cp and resistance Rs, to a circuit that is equivalent to an RC network, represented in the figure by capacitance Ci and resistance Ri. The voltage across resistance Ri is sampled by an analog-to-digital converter (ADC) 20, which is clocked by clock 21 at a suitable frequency f, for example, at least 20 MHz, at least 30 MHz, at least 50 MHz, at least 100 MHz. It is desirable that the sampling frequency f satisfy the following inequalities:

$$f > n(1/(RsCp)) \quad (1)$$

$$f > p(1/(RiCi)) \quad (2)$$

where n and p are positive real numbers greater than 1 and preferably greater than 5, greater than 10, greater than 20 or greater than 50.

Thereby, the voltage across the RC network is sampled at a plurality of instances during each pulse of the radiation source. The voltage that is sampled is proportional to the number of charge pairs generated in the photodiode, hence also to the number of photons falling on the photodetector in a predetermined period and the momentary intensity of the radiation beam. The total pulse energy is derived by digital processing of the samples output by ADC 20, for example by numeric integration. This is done by digital signal processor (DSP) 22, which may be a dedicated integrated circuit. In this way, it is possible to provide a measurement equivalent to that which would be produced by an ideal integrator (i.e. the total accumulated charge which is related to the total number of photons arriving at the sensor), but avoiding problems often associated with an integrator, such as the need to reset it before each pulse arrives.

To increase accuracy further, it is possible to sample the voltage across the RC network when the radiation source is off, either between pulses or when it is off for longer periods, such as between exposures, to determine the thermal photodetector current, which is then subtracted from measurements of the pulse energy. If the pulse repetition rate and amplitude of the radiation source is particularly high, compared to RsCp and RiCi, such that charge generated during one pulse has not completely drained away before the next pulse, this can be predicted and the predicted effect on pulse energy subtracted digitally.

Although the invention has been described herein applied to a normalization detector forming part of a transmission image sensor system, it will be appreciated that the invention can be used with any other sensor or sensor system that is used to measure the energy of a pulse, such as for example an energy sensor in the illumination system of a lithographic apparatus, an interferometric aberration sensor, a stray light sensor, a slit uniformity sensor, a relative polarization sensor, an apodization sensor, an absolute polarization sensor, an image quality sensor, or a wavefront aberration sensor.

Also, the invention can be used to determine the pulse arrival time at the sensor instead of, or in addition to, the measurement of the pulse energy. The multiple samples provided by the invention enable reconstruction of the pulse profile, from which the pulse arrival time—which may be defined as the mid-point of the pulse, the time of the peak intensity or the time of an initial rise in intensity—can be determined. When used in a measurement involving position, determination of the exact pulse arrival time and relating this to measurements of the position of the sensor, or the table carrying the sensor, can improve accuracy of the measurement. In particular, the pulse arrival time can be used to reset the clock of a position measurement system, such as position sensor IF, so as to ensure that the sensor measurements and position measurements are synchronized.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "connected," where the context allows, may refer to direct connections and indirect connections (e.g., through intervening equipment, structure, elements, and/or circuitry). For example, the expressions "electrically connected" or "connected electrically" may refer, where the context allows, to direct or indirect electrical connections (e.g., involving wires, intervening connectors, solder points, circuit traces, communications equipment, and/or other structures that achieve an electrically substantive connection) between or among components and/or equipment.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus having a sensor system comprising:
   a radiation-sensitive detector arranged to receive a pulsed radiation beam comprising radiation pulses having a nominal pulse duration and to generate a current in response thereto;
   a circuit equivalent to an RC network electrically connected across the radiation-sensitive detector and having a resistive component; and
   an analog-to-digital converter electrically connected across the resistive component of the circuit and arranged to output digital samples measuring voltage across the resistive component at a sampling rate that is greater than 1 divided by the nominal pulse duration,
   wherein the circuit has an equivalent resistance Ri and an equivalent capacitance Ci and the sampling rate f satisfies the following inequality:

$f > p(1/(RiCi))$ where p is a positive real number greater than 1.

2. The apparatus according to claim 1, wherein the sampling rate is greater than 5 divided by the nominal pulse duration.

3. The apparatus according to claim 1, wherein the sampling rate is greater than 10 divided by the nominal pulse duration.

4. The apparatus according to claim 1, wherein the sampling rate is greater than 20 divided by the nominal pulse duration.

5. The apparatus according to claim 1, wherein the sampling rate is greater than 50 divided by the nominal pulse duration.

6. The apparatus according to claim 1, wherein the radiation sensitive detector has an equivalent resistance Rs and an equivalent capacitance Cp, and the sampling rate f satisfies the following inequality:

$f > n(1(RsCp))$ where n is a positive real number greater than 1.

7. The apparatus according to claim 6, wherein n is greater than 50.

8. The apparatus according to claim 1, wherein p is greater than 50.

9. The apparatus according to claim 1, further comprising a digital signal processor electrically connected to the analog-to-digital converter to receive the digital samples and configured and arranged to calculate therefrom a measure of the energy of a pulse of the radiation beam.

10. The apparatus according to claim 1, further comprising a digital signal processor electrically connected to the analog-to-digital converter to receive the digital samples and configured and arranged to calculate therefrom a measure of the time of arrival of a pulse of the radiation beam.

11. The apparatus according to claim 10 further comprising a position measurement system configured and arranged to measure the position of the sensor and having a clock and a reset circuit configured to reset the clock based on the measure of the time of arrival of a pulse of the radiation beam.

12. Apparatus according to claim 1, wherein the radiation beam is electromagnetic radiation having a wavelength of less than or equal to about 365 nm.

13. Apparatus according to claim 1, wherein the radiation-sensitive detector is part of a transmission image sensor system.

14. Apparatus according to claim 1, wherein the radiation sensitive detector is part of an interferometric aberration sensor.

15. A device manufacturing method using a lithographic apparatus which has a radiation-sensitive detector arranged to receive a pulsed radiation beam comprising radiation pulses having a nominal pulse duration and arranged to generate a current in response thereto, the radiation-sensitive detector being electrically connected to a circuit which is equivalent to an RC network and has a resistive component, the method comprising:
   digitally sampling the voltage across the resistive component of the circuit at a sampling rate that is greater than 1 divided by the nominal pulse duration,
   wherein the circuit has an equivalent resistance Ri and an equivalent capacitance Ci and the sampling rate f satisfies the following inequality:

$f > p(1/(RiCi))$ where p is a positive real number greater than 1.

16. A method according to claim 15, wherein the sampling rate is greater than 5 divided by the nominal pulse duration.

17. A method according to claim 15, wherein the sampling rate is greater than 10 divided by the nominal pulse duration.

18. A method according to claim 15, wherein the sampling rate is greater than 20 divided by the nominal pulse duration.

19. A method according to claim 15, wherein the sampling rate is greater than 50 divided by the nominal pulse duration.

20. A method according to claim 15 wherein the radiation sensitive detector has an equivalent resistance Rs and an equivalent capacitance Cp, and the sampling rate f satisfies the following inequality:

$f > n(1/(RsCp))$ where n is a positive real number greater than 1.

21. The apparatus according to claim 20, wherein n is greater than 50.

22. The apparatus according to claim 15, wherein p is greater than 50.

23. An energy sensor comprising:
   a radiation-sensitive detector arranged to receive a pulsed radiation beam comprising radiation pulses having a nominal pulse duration and to generate a current in response thereto;
   a circuit equivalent to an RC network electrically connected across the radiation-sensitive detector and having a resistive component; and
   an analog-to-digital converter electrically connected across the resistive component of the circuit and arranged to output digital samples measuring the voltage across the resistive component at a sampling rate that is greater than 1divided by the nominal pulse duration, wherein the circuit has an equivalent resistance Ri and an equivalent capacitance Ci and the sampling rate f satisfies the following inequality:

$$f > p(1/(RiCi))$$

where p is a positive real number greater than 1.

24. The apparatus according to claim 1, wherein the sampling occurs during a pulse of the radiation beam.

25. The method according to claim 15, wherein the sampling occurs during a pulse of the radiation beam.

26. The sensor according to claim 23, wherein the sampling occurs during a pulse of the radiation beam.

27. The sensor according to claim 23, wherein p is greater than 50.

28. The sensor according to claim 23, wherein the radiation sensitive detector has an equivalent resistance Rs and an equivalent capacitance Cp, and the sampling rate f satisfies the following inequality:

$$f > n(1/(RsCp))$$

where n is a positive real number greater than 1.

29. The sensor according to claim 28, wherein n is greater than 50.

* * * * *